United States Patent
Shah et al.

(10) Patent No.: US 7,598,812 B2
(45) Date of Patent: Oct. 6, 2009

(54) SHORTED INPUT DETECTION FOR AMPLIFIER CIRCUITS

(75) Inventors: Pulkit Shah, Bangalore (IN); Gajender Rohilla, Bangalore (IN)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 11/818,172

(22) Filed: Jun. 12, 2007

(65) Prior Publication Data

US 2008/0001676 A1 Jan. 3, 2008

Related U.S. Application Data

(60) Provisional application No. 60/840,272, filed on Aug. 25, 2006.

(30) Foreign Application Priority Data

Jun. 16, 2006 (IN) .................. 1044/CHE/2006

(51) Int. Cl.
*H03F 3/08* (2006.01)

(52) U.S. Cl. .................. 330/308; 250/214 A

(58) Field of Classification Search .................. 330/84, 330/124 R, 126, 295, 308; 250/214 A
See application file for complete search history.

(56) References Cited

U.S. PATENT DOCUMENTS

| | | | | |
|---|---|---|---|---|
| 3,988,641 A * | 10/1976 | Hentschel et al. | ............. | 361/31 |
| 5,886,515 A * | 3/1999 | Kelly | .......................... | 323/313 |
| 6,097,296 A * | 8/2000 | Garza et al. | ................. | 340/601 |
| 6,252,409 B1 * | 6/2001 | Iijima | ........................... | 324/529 |
| 7,031,132 B1 | 4/2006 | Mitchell | | |

\* cited by examiner

*Primary Examiner*—Henry K Choe

(57) ABSTRACT

A method and an apparatus are described for shorted input detection for amplifier circuits. An embodiment of a circuit includes multiple amplifier circuits, with each amplifier circuit having an input and an output. The circuit also includes multiple short detection circuits, with one of the short detection circuits being coupled to the input of each amplifier circuit. Each short detection circuit has an active state for detection of short circuits and an inactive state for normal amplifier operation. The circuit also includes a register coupled with the output of each of the amplifier circuits to hold the output of one or more of the amplifier circuits.

19 Claims, 6 Drawing Sheets

SHORTED INPUT DETECTION FOR AMPLIFIER CIRCUITS

RELATED APPLICATIONS

This application claims the priority of U.S. Provisional Application Ser. No. 60/840,272, filed Aug. 25, 2006, which is hereby incorporated by reference. This application also claims the priority of India Patent Application No. 1044/CHE/2006, filed Jun. 16, 2006.

TECHNICAL FIELD

The invention relates generally to electronic circuits. More particularly, the invention relates to shorted input detection for amplifier circuits.

BACKGROUND

In a circuit such as an integrated circuit (IC), a short circuit or related problem may occur due to various factors, including undesirable contact among interconnects in the integrated circuit or contact by a foreign matter with an interconnect. These conditions may result in a short circuit, a current leakage, or an imperfect contact defect in an integrated circuit, which can lead to malfunction or damage, or may in some circumstances destroy an integrated circuit.

In an example, a photodiode in a circuit may suffer a short in certain circumstances. In operation, a photodiode provides an output current in response to incident light energy on a surface of the photodiode. The output current through the photodiode may be triggered by an optical signal received from an optical transmission medium. A device for converting projected optical data or images into electrical signal data may utilize an array of photodiodes. In a circuit, a transimpedance amplifier (TIA) is a device that converts an input current to an output voltage, and a TIA may be utilized to convert input current that is received from a photodiode into an output voltage that is proportional to a magnitude of the input current. In one possible example, an apparatus or system may include a vertical cavity surface emitting laser (VCSEL) system, a variety of semiconductor laser diode with laser beam emission.

In an apparatus or system, a component such as a photodiode array may be very dense, with closely spaced elements. The photodiode array may provide current to inputs of multiple TIA channels, which act to convert the generated current into various voltage signals. In such an apparatus, photodiode lines connecting to the TIA channels may run closely together in the densely packed photodiode array, and as a result such lines may become shorted with each other. However, it may be very time consuming to check for short circuits in each such device, and, even if the characteristics of a device are evaluated, defects may be difficult to detect if the defects are intermittent or only create current leakage, rather than a creating a direct short.

BRIEF DESCRIPTION OF THE DRAWINGS

The present invention is illustrated by way of example, and not by way of limitation, in the figures of the accompanying drawings in which like reference numerals refer to similar elements, and in which.

DETAILED DESCRIPTION

An embodiment of the present invention provides shorted input detection for amplifier circuits.

In one embodiment, a shorted input detector for an amplifier circuit is described. In an embodiment, the shorted input detector may be used in conjunction with an apparatus in which shorts between multiple amplifier inputs may occur. In one embodiment, a shorted input detector is provided in, for example, a transimpedance amplifier (TIA) circuit. In an example, a shorted circuit detector may be implanted in an integrated circuit including multiple lines, such as lines running between multiple photocells and TIA channels.

In an embodiment, a short detection circuit may be provided in each of multiple amplifier circuits in an apparatus, such as an integrated circuit. In an embodiment, a selected amplifier circuit may be tested for short circuit conditions. In such process, the selected amplifier circuit is driven with a predetermined voltage, while the voltage potential of each other amplifier circuit is driven to a different voltage potential. In an embodiment, the output of the selected circuit is enabled, and the output is compared to an expected value or prior value to determine whether a short has modified the output value of the selected amplifier circuit. The testing process then may continue for each other amplifier circuit in the apparatus to determine whether any of such amplifier circuits has a short condition.

In an embodiment, each short detection circuit includes one or more elements that will disproportionately favor a first voltage potential over a second voltage potential. In an embodiment, the elements will act to pull a selected amplifier circuit having a shorted circuit to the favored voltage potential of the circuit to which the selected amplifier circuit is shorted. In one embodiment, a selected amplifier circuit is driven with the second voltage potential, while each other amplifier circuit is driven with the first voltage potential. In an embodiment, the short detection circuit of an amplifier circuit to which the selected amplifier circuit is shorted will tend to pull the circuit to the first voltage potential, thereby modifying the output of the selected amplifier circuit. In an embodiment, a modification in the output of a selected amplifier circuit is detected and is used to determine that the selected amplifier circuit is shorted to another amplifier circuit.

Embodiments of amplifier circuits with short detection may include any architecture having multiple inputs to provide signals to multiple amplifier circuits. In an embodiment, each such amplifier circuit may include one or more inputs. For example, an amplifier circuit may include single ended input terminals, differential ended input terminals, or a combination of both for receiving input signals.

Figure 1:
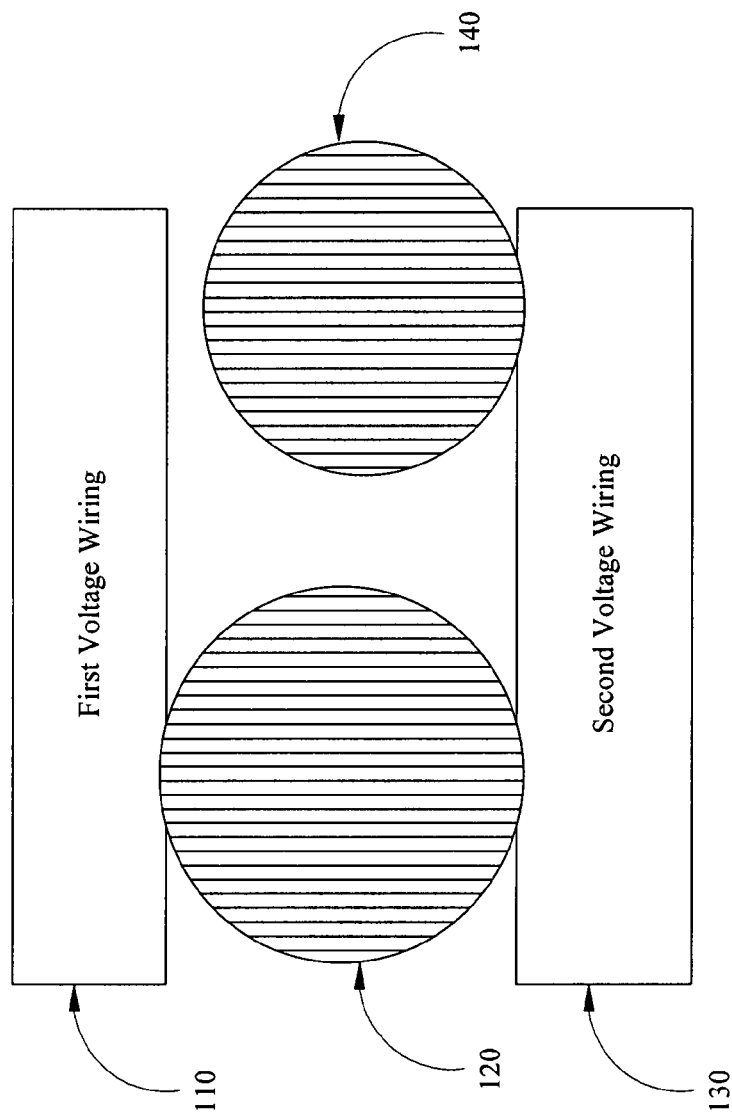
FIG. 1 illustrates an electrical system having with a short circuit.

FIG. 1 illustrates an electrical system 100 having a short circuit. The electrical system 100 includes a first voltage wiring 110 and a second voltage wiring 130. In one example, the wiring may represent lines running through a dense photodiode array. The voltage potential of the first voltage wiring 110 and the voltage potential of the second voltage wiring 130 may have different values.

The first voltage wiring 110 and the second voltage wiring 130 may be short-circuited by, for example, a conductive foreign matter 120. As illustrated, the conductive foreign matter 120 could in some circumstances be detected as being defective if the foreign matter 120 is in direct contact with the voltage wiring and thus caused a direct short circuit.

However, if a conductive foreign matter is located slightly apart from one of the first and second voltage wirings 110 or 130, such as with conductive foreign matter 140, then a consistent short circuit will not be present, and the short generally will not be detected by a conventional short circuit detection test. However, a defect is present, and it may cause an intermittent short, current leakage, or other related short circuit conditions.

In an embodiment, a system is implemented to provide detection for the short circuit using the operation of amplifiers in the apparatus. In an embodiment, the difference in voltage potential between the wirings is used in detection by applying circuitry that will tend to pull the voltage of an amplifier circuit under test to the voltage of a circuit to which the circuit under test is shorted.

Figure 2:
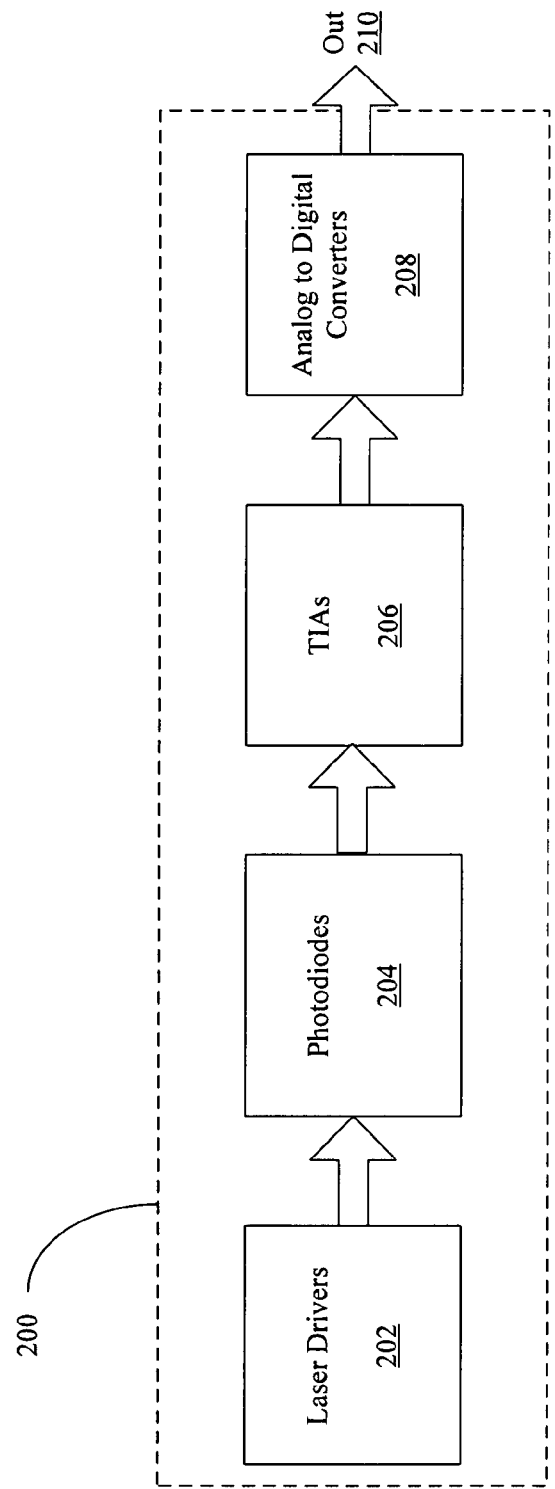
FIG. 2 illustrates a single input Vertical Cavity Surface Emitting Laser (VCSEL) system.

FIG. 2 illustrates a single input Vertical Cavity Surface Emitting Laser (VCSEL) system 200. An apparatus utilizing short detection may include, but is not limited to, a VCSEL system. A VCSEL system 200 may include multiple laser drivers 202 providing signals to inputs of multiple photodiodes 204, which produce current signals. The current signals are provided to a set of transimpedance amplifier channels 206 to convert the current signals to amplified voltage signals. The transimpedance amplifier channels 206 then provide the generated voltage signals to a set of analog to digital converters 208, which convert the analog signals to digital values to provide an output 210. The photodiodes 204 may be included in a photodiode array, which may be a very dense metal array including multiple metal lines carrying voltage potentials. Because of the high density nature of the array, the photodiode lines are routed near to each other, and thus may short to each other if there are imperfections in the apparatus or is foreign matter is interspaced between lines.

In an embodiment, each transimpedance amplifier channel 206 may include or may be coupled with a short detection circuit. In an embodiment, the short detection circuits may be enabled for the detection of short circuits and be disabled in normal operation. In an embodiment, each of the amplifier channels is tested to determine whether a short condition exists for the amplifier input in relation to another amplifier channel.

Figure 3:
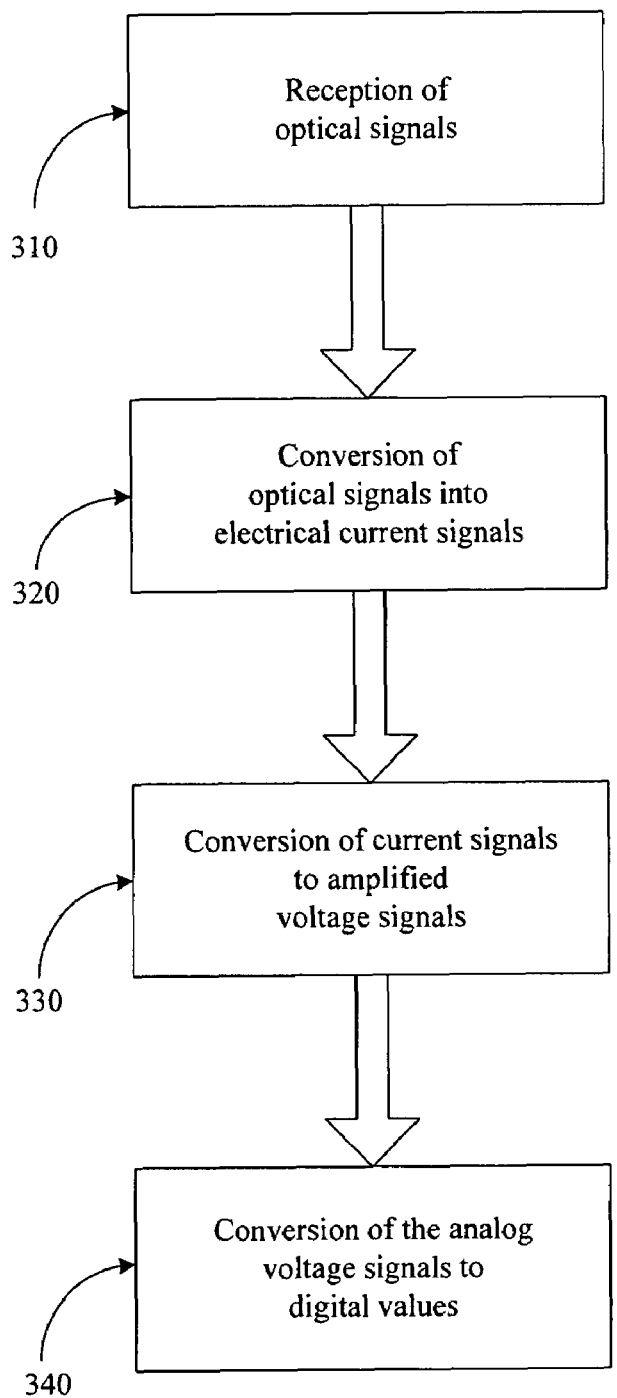
FIG. 3 is a flow chart to depict the operation of a VCSEL system.

FIG. 3 is a flow chart 300 to depict the operation of a VCSEL system, such as VCSEL system 200 illustrated in FIG. 2. In the illustrated operation, the VCSEL system receives optical signals via a set of laser drivers 310. The optical signals are converted into electrical current, such as by operation of photodiodes 320. A set of transimpedance amplifiers may then operate to convert the current signals to produce amplified voltages 330, which represent analog signal values. The voltage outputs from the transimpedance amplifiers are converted to digital signals, such as through the operation of multiple analog to digital converters 340.

In the operation of a system such as the VCSEL system 200 illustrated in FIG. 2, multiple photodiode current signals are input to a set of transimpedance amplifiers 206. In a conventional process, short circuits (or shorts) between photodiode inputs 204 may in certain circumstances be found by performing characterization of every circuit die that is produced. Such a process is a very time consuming exercise and thus may be inadequate for detecting shorted inputs in devices. In addition, rather than a direct short circuit or a shorted input node occurring, a leakage or an imperfect contact may lead to malfunction, with the leakage or faulty contact often being undetected. In an embodiment, short circuit detection circuits are provided in conjunction with amplifier circuits, with such circuits utilizing the operation of the amplifiers contained within an apparatus to detect the short conditions.

Figure 4:
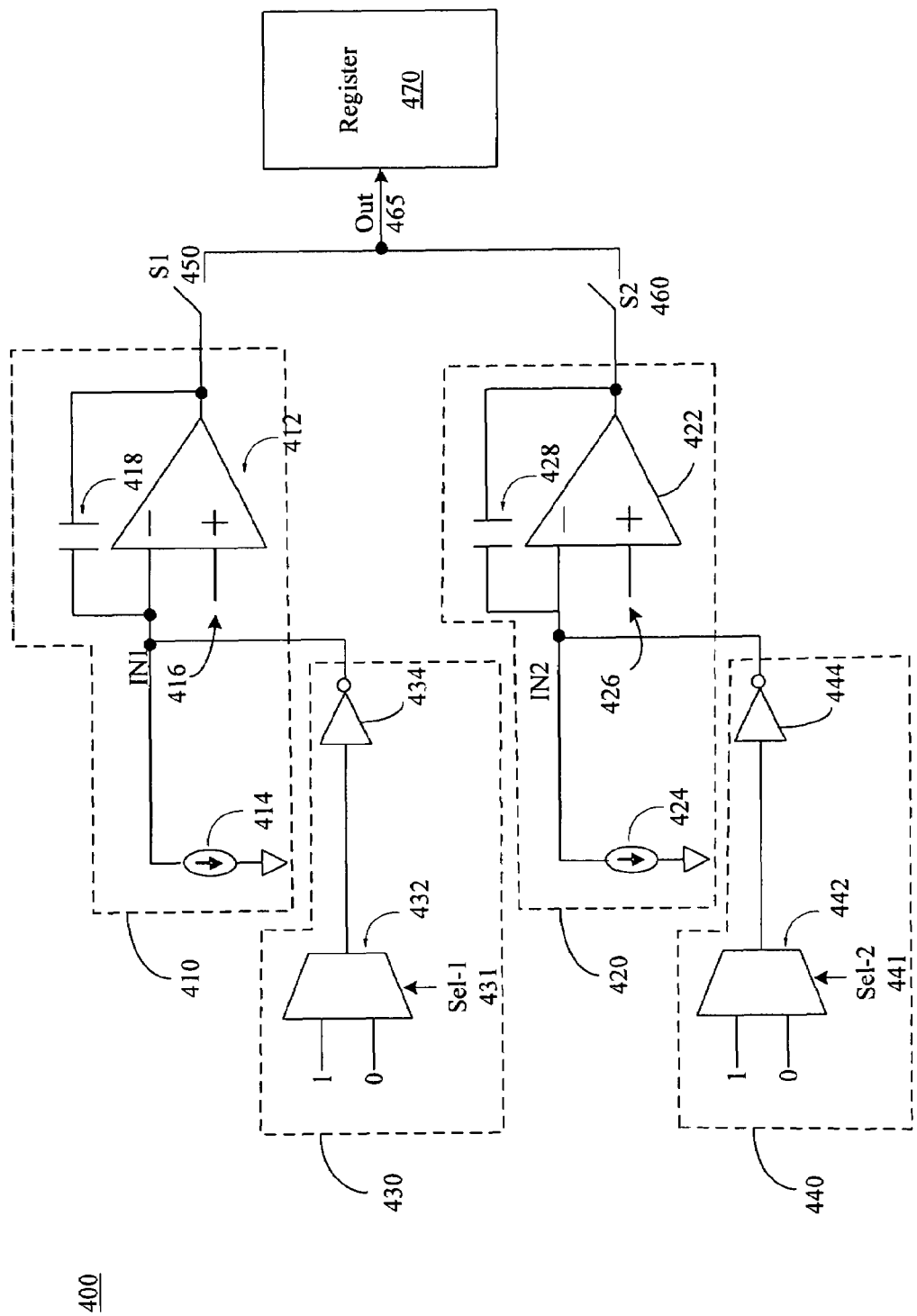
FIG. 4 illustrates an embodiment of a transimpedance amplifier circuit.

FIG. 4 illustrates an embodiment of a transimpedance amplifier circuit 400. Circuits utilizing embodiments of short detection may include, but are not limited to, transimpedance amplifier circuits. In this illustration, the transimpedance amplifier circuit 400 may include a minimum of two transimpedance amplifiers, with a maximum up to any number n transimpedance amplifiers, wherein n is a positive integer. In an embodiment, each transimpedance amplifier may include a single-sided or differential amplifier. In a particular embodiment, a transimpedance amplifier circuit 400 includes a first transimpedance amplifier 410 and a second transimpedance amplifier 420. In this illustration, the amplifiers are single ended amplifiers, each containing a single input. The amplifier circuit 400 further includes a first short detection circuit 430 for the first transimpedance amplifier 410 and a second short detection circuit 440 for the second transimpedance amplifier 420. The amplifier circuit may further include a first switch 450 (S1) having a first end coupled with an output of the first transimpedance amplifier 410 and a second switch 460 (S2) having a first end coupled with an output of the second transimpedance amplifier 420, with a second end of S1 450 and S2 460 being coupled with a register 470 to register the resulting output signal 465.

In this illustration, the first transimpedance amplifier 410 includes an operational amplifier 412 having an inverting input (−), a non-inverting input (+), and an output terminal, with a photodiode 414 being coupled to the inverting input (−), a reference voltage 416 being coupled to the non-inverting input (+), and a capacitor 418 being coupled between the inverting input (−) and the output terminal of the operational amplifier 412. Similarly, the second transimpedance amplifier 420 includes an operational amplifier 422 including an inverting input (−), a non-inverting input (+), and an output terminal, with a photodiode 424 coupled to the inverting input (−), a reference voltage 426 coupled to the non-inverting input (+), and a capacitor 428 being coupled between the inverting input (−) and the output terminal of the operational amplifier 422.

The operational amplifiers 412 and 422 include multiple metal oxide semiconductor (MOS) transistors. The MOS transistors within the operational amplifiers are coupled between a higher voltage supply $V_{dd}$ and a lower or negative voltage supply $V_{ss}$. $V_{dd}$ signifies drain terminal to drain terminal voltage of a MOS transistor and $V_{ss}$ signifies source terminal to source terminal voltage of a MOS transistor. The reference voltages 416 and 426 may, for example, equalize half of the higher voltage supply ($V_{dd}/2$) or any internal or external reference voltage.

The first short detection circuit 430 may include a 2-to-1 multiplexer 432 and a first controllable inverter 434. The 2-to-1 multiplexer 432 includes a first data input fed with a logical "1" signal (corresponding to a higher voltage supply $V_{dd}$), a second data input fed with a logical "0" signal (corresponding to a lower voltage supply $V_{ss}$ or $V_{gnd}$) and a control input 431 (Sel-1) for selecting one of the first data input and second data input. The lower voltage supply may also be referred to as voltage of a grounded node. An output of the 2-to-1 multiplexer 432 is coupled to an input of the first controllable inverter 434. The second short detection circuit 440 also includes a 2-to-1 multiplexer 442 and a second controllable inverter 444. The 2-to-1 multiplexer 442 similarly includes a first data input fed with a logical "1" signal, a second data input fed with a logical "0" signal, and a control input 441 (Sel-2) for selecting one of the first data input and second data input. An output of the 2-to-1 multiplexer 442 is coupled to an input of the second controllable inverter 444. In an embodiment, an output from the first controllable inverter 434 is coupled to a common node of the photodiode 414 output and the inverting input (−) of the operational amplifier 412, and an output from the second controllable inverter 444 is coupled to a common node of the photodiode 424 output and the inverting input (−) of the operational amplifier 422.

In operation, an inverted input (−) of the first transimpedance amplifier 410 may be short circuited (shorted) with an inverted input (−) of the second transimpedance amplifier 420. These inverted inputs to each of the first transimpedance amplifier 410 and second transimpedance amplifier 420 represent the lines from photodiodes 414 and 424, which may become shorted or with any other input in a photo array. In an embodiment, the first and second short detection circuits 430 and 440 may be utilized in detection of any shorted inputs.

In an embodiment, the first transimpedance amplifier 410 and the second transimpedance amplifier 420 are coupled with each other via the first switch 450 (S1) and the second switch 460 (S2). The first switch 450 and second switch 460 each may receive an enable signal (not shown) that enables the output through one switch and disables the output through the other switch. In an embodiment, a common node of the first switch 450 and the second switch 460 may be connected to the register 470 through an output node 465 "Out" for registering information for short circuited input of a transimpedance amplifier. Enabling one of the two switches (450 and 460) causes an output corresponding to a short circuited input to be registered, while the transimpedance amplifier or amplifiers corresponding to the disabled switch or switches are prevented from outputting voltage signals.

In an embodiment, the first controllable inverter 434 and the second controllable inverter 444 are logic inverters that enable or disable the short detection circuits 430 and 440, while the conversion of photodiode current to voltage is controlled by enabled or disabled states of the first switch 450 and the second switch 460. Each logic inverter may be enable to connect to the input node of the respective transimpedance amplifier circuits to provide short circuit detection, or may be disable to disconnect from the input node of each transimpedance amplifier to remove the short detection feature from the transimpedance amplifiers in normal operation. As inverters, each logic inverter will convert a logical "0" signal to a logical "1" signal, and vice versa.

In an embodiment, the controllable inverters 434 and 444 operate to prefer one voltage state to another, with this characteristic being utilized to detect short circuit conditions. In an embodiment, NMOS transistors contained in the devices may be designed to disproportionately drive low signals over the operation of PMOS transistors driving high signals. In another embodiment, the operation may be reversed and the PMOS transistors may be designed to disproportionately drive high signals over NMOS transistors driving low signals. Embodiments of the invention are not limited to these technologies, but may include any devices that disproportionately favor a first voltage potential over a second voltage potential.

In an example, the short detection circuits 430 and 440 may be enabled to detect a short condition in the first transimpedance amplifier 410. If a low (logical "0"/$V_{gnd}$) signal is applied to the input of the first controllable inverter 434, such inverter outputs a high (logical "1"/$V_{dd}$). A high signal is then applied to the input of the second controllable inverter 444, and the inverter then outputs a low signal. However, in an embodiment the NMOS transistors have higher drive strength than the PMOS transistors for each of the first and second controllable inverters (434 and 444). As a result, the NMOS transistor(s) for the inverter 444 of each non-selected circuit (the second transimpedance amplifier 420 in this case) will pass a strong low signal (logical "0") in comparison to a weaker high signal (logical "1") that is passed by the PMOS transistor(s) of the inverter 434 of the selected circuit (first transimpedance amplifier 410 in this case). The strong output of the second controllable inverter 444 can therefore conveniently pull a shorted node (a shorted photodiode input) to the ground potential, if a short exists. In one particular embodiment, the NMOS transistors may designed to have a drive strength that is, for example, ten times stronger than the drive strength of the counterpart PMOS transistors, thereby providing a significant advantage in pulling shorted circuits to low, even if a short is less than a complete short circuit.

In one embodiment, each of the first controllable inverter 434 and second controllable inverter 444 includes a tristate inverter. A tristate inverter includes an input terminal for receiving an input signal, an output terminal for generating an inverted form of the input signal, and a control terminal, which enables the tristate inverter for inverting the input signal. Each tristate inverter may be disabled (such as by applying a logical "0" signal at the control terminal) if a photodiode current is to be converted to an equivalent voltage through the transimpedance amplifiers in normal operation. Each tristate inverter may be enabled (by applying a logical "1" signal) to enable the shorted input detection for a transimpedance amplifier. In operation, an enabled tristate inverter functions as a closed inverting switch and a disabled tristate inverter functions as an open high impedance switch.

In another embodiment, the controllable inverters may include a standard logic inverter rather than a tristate inverter. In this illustration, the second transimpedance amplifier 420, for example, would not convert photodiode current into voltage while the logic inverter is connected at an input node of the second transimpedance amplifier 420, thus eliminating the need for enabling or disabling the inverter.

Figure 5:
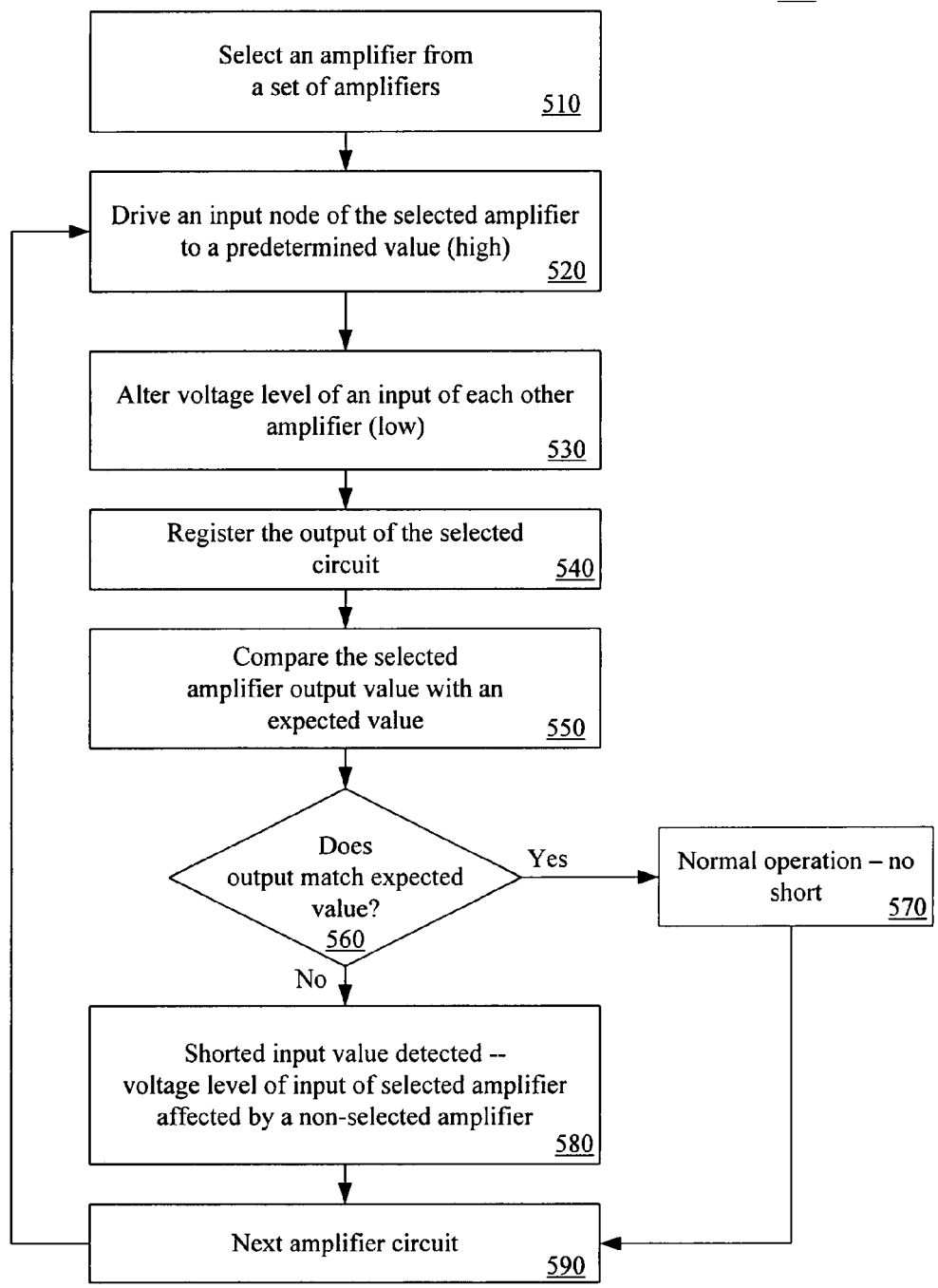
FIG. 5 is a flow chart to illustrate an embodiment of a process for detecting shorted inputs in a transimpedance amplifier circuit.

FIG. 5 is a flow chart 500 to illustrate an embodiment of a process for detecting shorted inputs in an amplifier circuit, such as the amplifier circuit 400 illustrated in FIG. 4. In the illustrated process, an amplifier is selected from a set of amplifiers 510. In an embodiment, selecting an amplifier may include enabling the output of the selected amplifier and disabling the outputs of the other amplifiers. The voltage of an input for the selected amplifier is set to a first voltage potential, which may be a higher voltage supply corresponding to the power supply node, or logical "1" 520.

In an embodiment, the voltage potential of an input of each other amplifier of the set of amplifier is altered by providing a second voltage potential to each other amplifier 520. In this process, a signal corresponding to a low signal (logical "0"/$V_{gnd}$) is applied to the input of each non-selected amplifier via an enabled (low impedance state) inverter. In this embodiment, the NMOS transistor(s) of each inverting circuit are stronger than the PMOS transistor(s), thus enabling a strong logical "0" reception at the photodiode input of each amplifier circuit other than the selected amplifier.

In an embodiment, the output of the selected circuit is stored to a register 540, and the output value is compared with an expected value 550. The comparison of the output of the selected circuit to the expected value, which may be a high signal value in this example, it may be determined whether the selected circuit has been affected by a short, in which case the output would have then been pulled down to a low signal value does not match the expected value. Thus, if the output matches the expected value 560, then it may be concluded that there is normal operation and there are no shorts with the inputs of any other amplifiers 570. If the output does not match, then it may be concluded that a shorted input value has been detected because the voltage level of the input has been affected by the input of a non-selected amplifier 580. The process may then continue to the next amplifier in the circuit 590 until all amplifier circuits have been tested.

In an embodiment, an amplifier circuit may include one or more differential amplifiers, with each differential amplifier including a first input and a second input. In an embodiment, a differential amplifier may be selected to test for shorts with any of the other (non-selected) amplifier circuits, and for shorts between the first and second inputs of the selected differential amplifier circuit.

Figure 6:
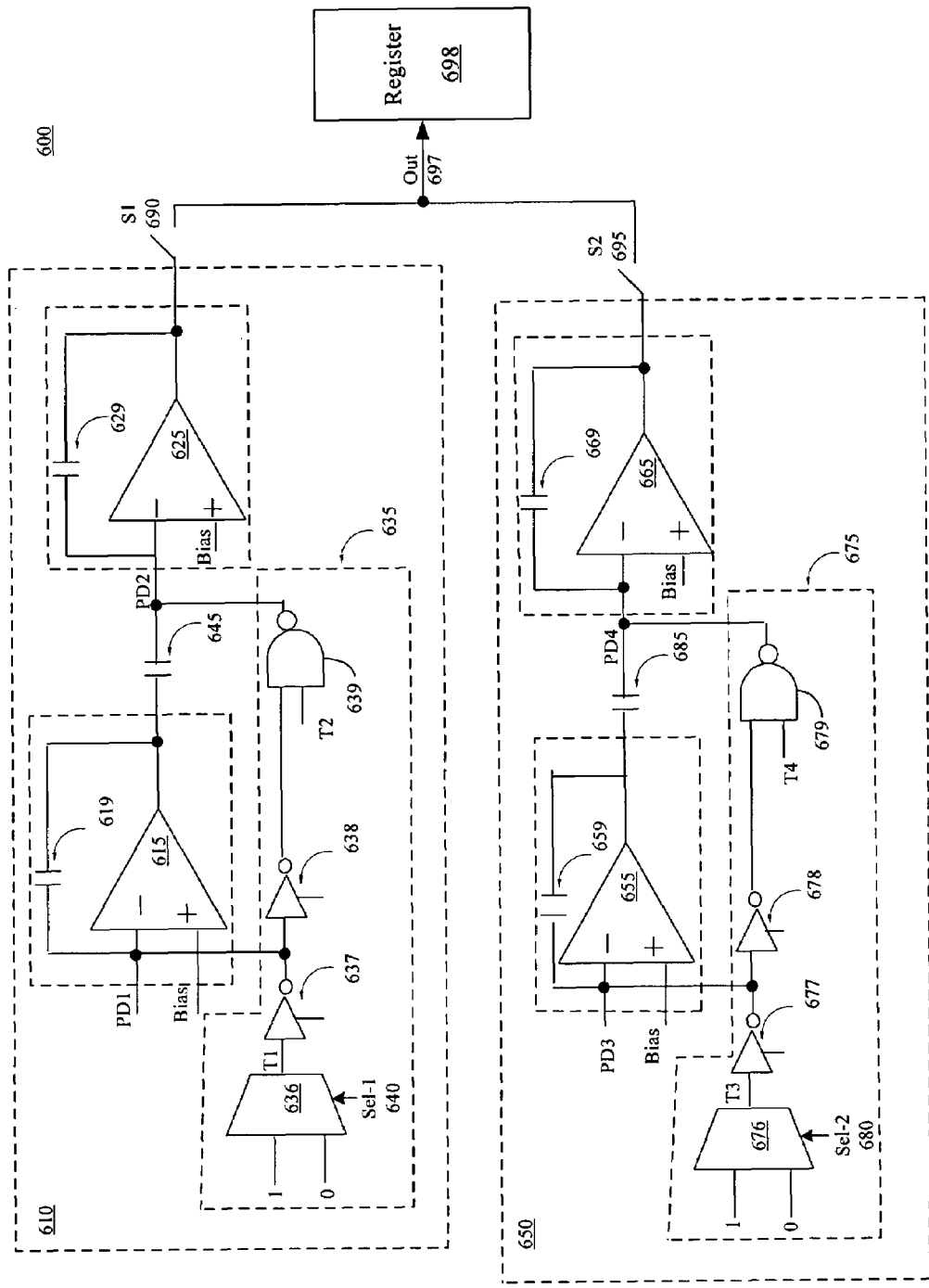
FIG. 6 is an illustration of an embodiment of a transimpedance amplifier circuit including differential amplifiers.

FIG. 6 is an illustration of an embodiment of a transimpedance amplifier circuit including differential amplifiers. A particular differential amplifier architecture may include twelve amplifier channels, although an amplifier system may have any number of channels. In one example, of the twelve channels of the differential TIA system, eight channels may be differential and four channels may be single ended. In FIG. 6, a differential TIA circuit 600 includes a first differential TIA 610 and a second differential TIA 650, with there possibly being one more other amplifier circuits that are not illustrated in this figure. The circuit 600 could also be illustrated as a differential TIA and a single ended TIA.

The first differential TIA 610 includes a first operational amplifier 615, a second operational amplifier 625, a short detection circuit 635, and a capacitor 645. The second differential TIA 650 includes a first operational amplifier 655, a second operational amplifier 665, a short detection circuit 675, and a capacitor 685. The first differential TIA 610 and the second differential TIA 650 are coupled to each other through switches 690 (S1) and 695 (S2). Each of the switches (690 and 695) receives an enable signal, which will enable one of the switches and disable any others. A common node of the switches (690 and 695) may be connected to a register 698 through an output node 697 "Out" for the purpose of registering the output of the selected transimpedance amplifier. If a short exists, enabling one of the two switches (690 and 695) will cause an output corresponding to the short circuited input to be registered, while the outputs of transimpedance amplifier(s) corresponding to the disabled switch(s) are disabled.

In the first differential TIA 610, the first operational amplifier 615 includes an inverted input (−) node (PD1—indicating Photo Diode 1), a non-inverted input (+) node, an output node, and a capacitor 619 coupled between the inverted input (−) node and the output node. The second operational amplifier 625 includes an inverted input (−) node (PD2), a non-inverted input (+) node, an output node and a capacitor 629 coupled between the inverted input (−) node and the output node. The short detection circuit 635 includes a 2-to-1 multiplexer 636, a first tristate inverter 637, a second tristate inverter 638, and logic NAND gate 639. The 2-to-1 multiplexer 636 includes a first data input fed with a logical "1" signal, a second data input fed with a logical "0" signal, and a select input 640 (Sel-1) for selecting one of the first data input and the second data input. The first tristate inverter 637 includes a first input terminal (T1), a control terminal, and an output terminal. The output terminal of the first tristate inverter 637 is coupled to an input terminal of the second tristate inverter 638. The second tristate inverter 638 also includes a control terminal and an output terminal. The logic NAND gate 639 includes a first input terminal, a second input terminal (T2), and an output terminal.

In the second differential TIA 650, the first operational amplifier 655 includes an inverted input (−) node (PD3), a non-inverted input (+) node, an output node, and a capacitor 659 coupled between the inverted input (−) node and the output node. The second operational amplifier 665 includes an inverted input (−) node (PD4), a non-inverted input (+) node, an output node and a capacitor 669 coupled between the inverted input (−) node and the output node. The short detection circuit 675 includes a 2-to-1 multiplexer 676, a first tristate inverter 677, a second tristate inverter 678, and logic NAND gate 679. The 2-to-1 multiplexer 676 has a first data input fed with a logical "1" signal, a second data input fed with a logical "0" signal, and a select input 680 (Sel-2) for selecting one of the first data input and the second data input. The first tristate inverter 677 includes a first input terminal (T3), a control terminal, and an output terminal. The output terminal of the first tristate inverter 677 is coupled to an input terminal of the second tristate inverter 678. The second tristate inverter 678 also includes a control terminal and an output terminal. The logic NAND gate 679 includes a first input terminal, a second input terminal (T4) and an output terminal, wherein the first input terminal is coupled to the output of the second tristate inverter 678. In an embodiment, the PD1 and PD2 inputs to the first differential TIA 610 and the PD3 and PD4 inputs to the second differential TIA 650 come from a photodiode array that provides multiple photodiode outputs.

In describing the operation of the differential TIA circuit 600, two cases may be considered for each channel. In the first case, PD2 can short to any other TIA inputs (PD1, PD3, PD4 . . . ). In the second case, PD1 can short to any other TIA inputs (PD2, PD3, PD4 . . . ). In an embodiment, all inverters (637, 638, 677, and 678) and logic NAND gates (639 and 679) are tri-stable, and are enabled only during a testing mode. In an embodiment, the circuit detection circuits disproportionately favor a first voltage potential over a second voltage potential. In an example, the size of NMOS transistors may be, for example, five times greater than PMOS transistors for the inverters (637, 638, 677, and 678) and logic NAND gates (639 and 679).

In an embodiment, if a short on PD2 is to be determined, then a low signal (logical "0"/$V_{gnd}$) is applied on T2 (second input terminal of the logic NAND gate 639) and a high signal (logical "1"/$V_{dd}$) is applied to the rest of the inputs (input terminals of the tristate inverters and logic NAND gates). A low on T2 makes the PD2 node high and first differential TIA 610 output low. If there is any short of PD2 with any other node (PD1, PD3, PD4 or any other input) then PD2 will become low since the shorted line (PD1, PD3, PD4 or any other) will drive PD2 node low because the NMOS drive strength is much higher than PMOS drive strength. Similarly if PD1 node shorts with any other node (PD2, PD3, PD4 or any other), the short can be detected by applying a low signal on T1 (input terminal of the first tristate inverter 637) through the 2-to-1 multiplexer 636 and a high signal on each other inputs (input terminals of the tristate inverters and logic NAND gates). Applying low on T1 implies that the select terminal 640 of the 2-to-1 multiplexer 636 is fed with a high signal to provide a low signal on the input terminal of the first tristate inverter 637 and the select terminal 680 of the 2-to-1 multiplexer 676 is fed with a low signal for providing a high on the input terminal of the first tristate inverter 677.

If there is a short between PD1 and PD2, it may be detected by applying low on T2 and high on rest of the inputs. Applying low on T1 and high on rest of the inputs would be an invalid test in this case because of the property of the logic NAND gate 679 of generating a high if a low is applied on at least one input terminal. However, shorting on PD2 (PD4 ... ) may be found by applying low on T2 (T4 ... ). The same procedure can be followed for each TIA of the twelve channel differential TIA circuit. Thus, all the shorts on PD2 (from PD1, PD3, PD4 ... or any combination) may be found by applying low on T2 and high on the rest of the inputs. All the short on PD1 (from PD3, PD4 ... or any combination) may be found by applying low on T1 and high on the rest of the inputs.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions including code contained in a computer usable medium.

For purposes of clarity, many of the details of the improved short circuit detector for a transimpedance amplifier and the methods of designing and manufacturing the same that are widely known and are not relevant to the present invention have been omitted from the following description.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices may be shown in block diagram form.

The present invention includes various processes. Certain processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Methods herein may be described in their most basic form, but processes can be added to or deleted from any of the methods and information can be added or subtracted from any described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

What is claimed is:

1. A circuit comprising:
    a plurality of amplifier circuits, each amplifier circuit having an input and an output;
    a plurality of short detection circuits, a short detection circuit of the plurality of short detection circuits being coupled to the input of each amplifier circuit, each short detection circuit having an active state for detection of short circuits and an inactive state for normal amplifier operation; and
    a register coupled with the output of each of the plurality of amplifier circuits, the register to hold the output of one or more of the amplifier circuits.

2. The circuit of claim 1, wherein the input of each amplifier circuit is coupled with a photodiode and wherein each amplifier circuit comprises a transimpedance amplifier.

3. The circuit of claim 1, wherein each short detection circuit has a preference for driving a first voltage potential over driving a second voltage potential.

4. The circuit of claim 3, wherein each short detection circuit includes a first type of transistor and a second type of transistor, and wherein the first type of transistor has a stronger drive strength than the second type of transistor.

5. The circuit of claim 4, wherein the first type of transistor is an NMOS transistor and the second type of transistor is a PMOS transistor.

6. The circuit of claim 1, wherein each short detection circuit includes a logic inverter.

7. The circuit of claim 6, wherein each logic inverter is a tristate inverter, the active state of each short detection circuit providing a high or low signal to the input of the amplifier circuit to which the short detection circuit is coupled and the inactive state of each short detection circuit providing a high impedance signal to the input of the amplifier circuit to which the short detection circuit is coupled.

8. A method of detecting a shorted input in an amplifier circuit comprising:
    driving an input node of a first amplifier of a plurality of amplifiers to a first voltage potential;
    driving an input node of each other amplifier of the plurality of amplifiers to a second voltage potential;
    comparing an output of the first amplifier to an expected value; and
    if the output of the first amplifier does not match the expected value, determining that a short exists between the input node of the first amplifier and the input node of one or more of the other amplifiers of the plurality of amplifiers.

9. The method of claim 8, further comprising enabling a shorted input detector for each of the plurality of amplifiers.

10. The method of claim 9, wherein each shorted input detector provides a voltage signal to an input node when enabled and provides a high impedance connection to the input node when disabled.

11. The method of claim 9, wherein enabling the shorted input detector for an amplifier provides a stronger drive for the second voltage potential than for the first voltage potential.

12. The method of claim 8, further comprising pulling the voltage potential of the input node of the first amplifier towards the second voltage potential via a short with the input node of one or more of the other amplifiers.

13. The method of claim 8, further comprising storing the output of the first amplifier in a register.

14. The method of claim 8, further comprising repeating processes for detection of a short for each of the other amplifiers of the plurality of amplifiers.

15. The method of claim 8, wherein the first amplifier has a second input, and further comprising driving the second input of the first amplifier to the second voltage potential.

16. A system comprising:
a plurality of amplifier channels including at least one differential amplifier channel, the differential amplifier channel including a first input and a second input; and
a plurality of short detection circuits, a short detection circuit being coupled with each of the plurality of amplifier channels, a short detection circuit being coupled with the differential amplifier channel at the first input and at the second input, wherein the plurality of short detection circuits are utilized in detecting shorts between any of the amplifier channels and between the first input and the second input of the differential amplifier channel.

17. The system of claim 16, wherein detection of a short for the differential amplifier channel includes:
driving the first input of the differential amplifier channel to a first potential and driving the second input of the differential amplifier channel and all inputs for all other amplifier channels to a second potential; and
driving the second input of the differential amplifier channel to the first potential and driving the first input of the differential amplifier channel and all inputs for all other amplifier channels to the second potential.

18. A system comprising:
a plurality of amplifier channels including at least one differential amplifier channel, the differential amplifier channel including a first input and a second input; and
a plurality of short detection circuits, a short detection circuit being coupled with each of the plurality of amplifier channels, a short detection circuit being coupled with the differential amplifier channel at the first input and at the second input, wherein the short detection circuit coupled with the differential amplifier channel comprises an inverter coupled with the first input and a NAND gate coupled with the second input.

19. A system comprising:
a plurality of amplifier channels including at least one differential amplifier channel, the differential amplifier channel including a first input and a second input; and
a plurality of short detection circuits, a short detection circuit being coupled with each of the plurality of amplifier channels, a short detection circuit being coupled with the differential amplifier channel at the first input and at the second input, wherein the plurality of amplifier channels are coupled with a plurality of outputs from a photodiode array.

* * * * *